United States Patent [19]

Bachand et al.

[11] Patent Number: 4,869,119
[45] Date of Patent: Sep. 26, 1989

[54] PROXIMITY DETECTOR, WITH ADJUSTABLE ORIENTATION OF ITS HEAD

[75] Inventors: George M. Bachand, Plantsville, Conn.; Jean-Claude Vignaud, St Yrieix; Gérard Juery, Magnac S/Touvre, both of France

[73] Assignee: La Telemecanique Electrique, Nanterre Cedex, France

[21] Appl. No.: 137,017

[22] Filed: Dec. 23, 1987

[30] Foreign Application Priority Data

Dec. 23, 1986 [FR] France .................. 86 18111

[51] Int. Cl.$^4$ ............................................. H02K 5/00
[52] U.S. Cl. .................... 73/866.5; 174/52.1
[58] Field of Search ............... 73/866.1, 866.5; 174/50, 52 R, 52.1; 328/5; 361/179, 180, 181; 307/116; 200/DIG. 1; 324/234–238, 156; 340/551–564, 693

[56] References Cited

U.S. PATENT DOCUMENTS

| | | |
|---|---|---|
| 4,314,310 | 2/1982 | Schmidt ............................ 361/331 |
| 4,420,651 | 12/1983 | Teich .................................. 174/50 |
| 4,552,987 | 11/1985 | Stebegg et al. .................. 361/179 |
| 4,654,471 | 3/1987 | Masaki et al. .................... 361/179 |

FOREIGN PATENT DOCUMENTS 7215121 9/1972 Fed. Rep. of Germany.
7344278 4/1974 Fed. Rep. of Germany.

Primary Examiner—Robert R. Raevis
Attorney, Agent, or Firm—Young & Thompson

[57] ABSTRACT

A detector head can assume two positions selectively on a mount which is in turn fixed with adjustable orientation on the cover of the casing. Two and the same perpendicular channels in the head, and two and the same perpendicular tapped holes in the mount are occupied by two screws fixing the head on the mount in the two positions of the head on the mount. The channels extend along two edges of the head without obstructing the space available inside. They converge towards an edge along which the mount extends in a very compact form. The two perpendicular screws provide a strong and compact connection between the head and the mount.

10 Claims, 2 Drawing Sheets

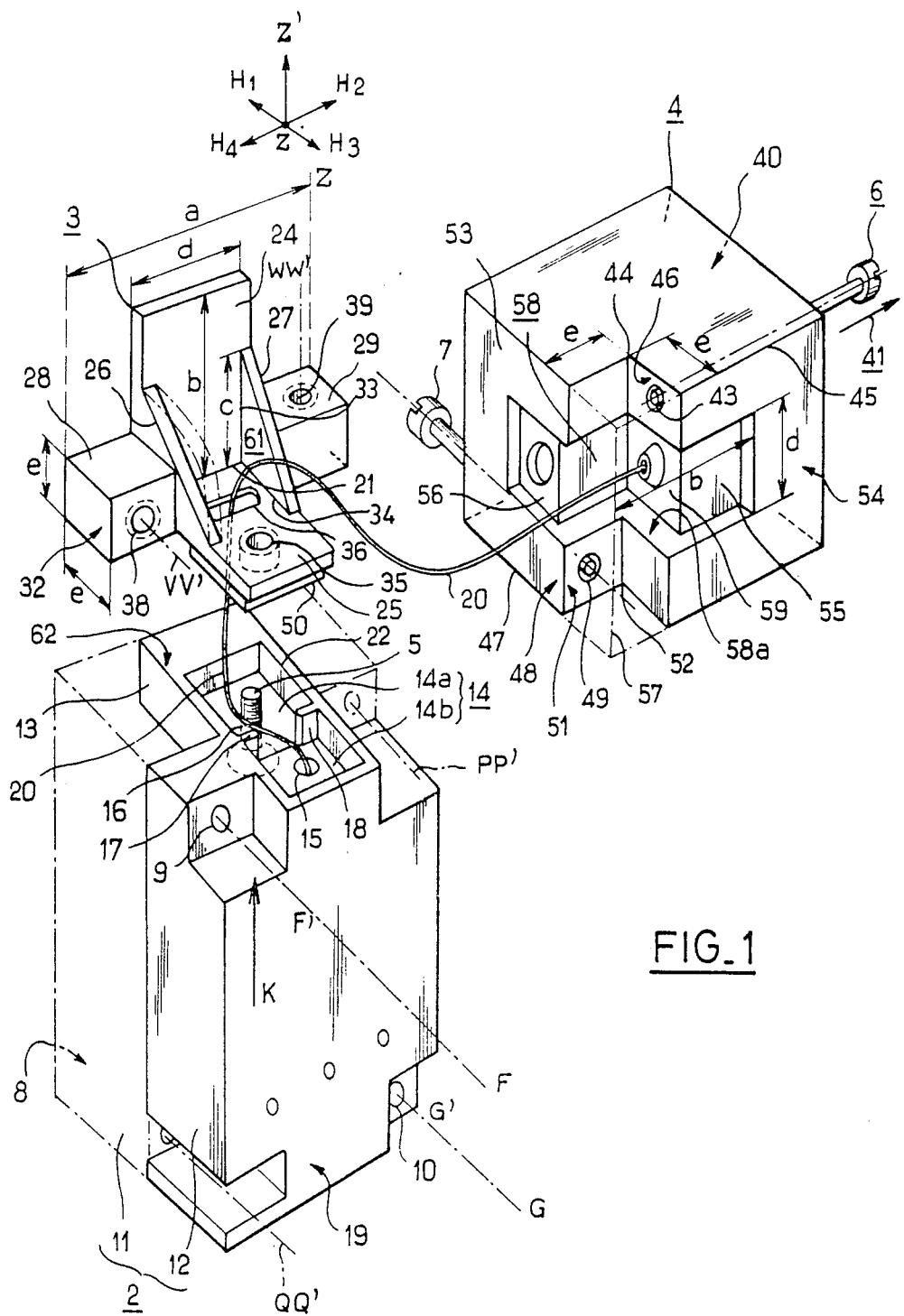
FIG_1

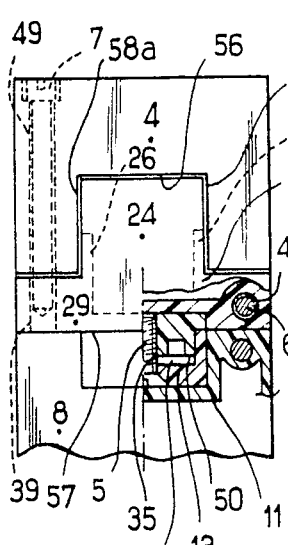
FIG_5
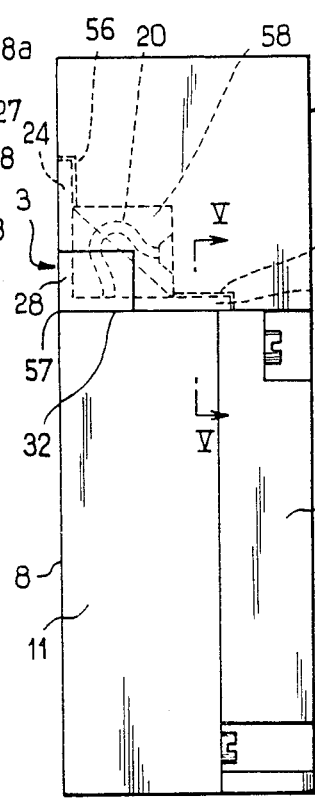
FIG_2
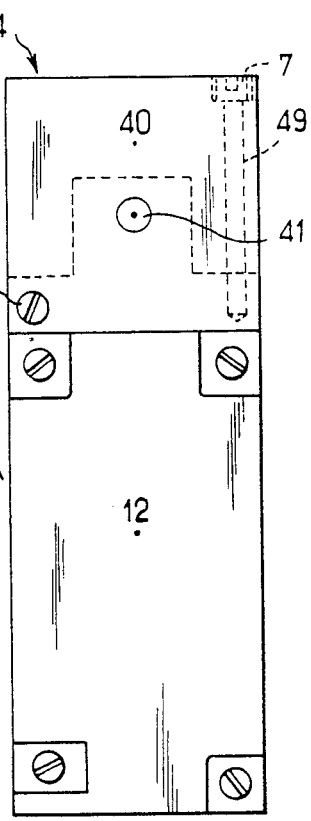
FIG_3
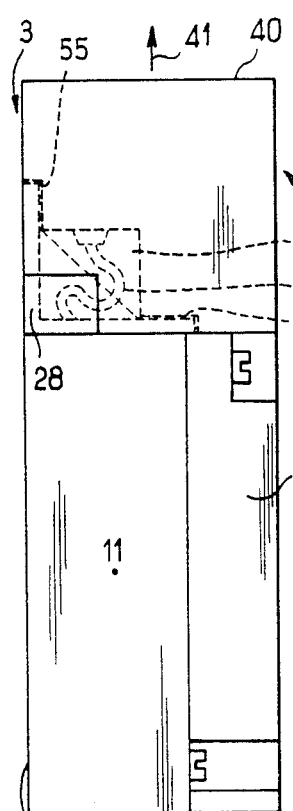
FIG_6
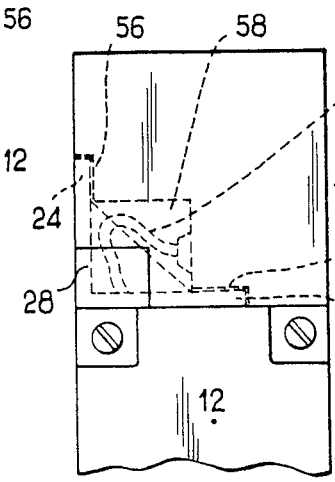
FIG_7
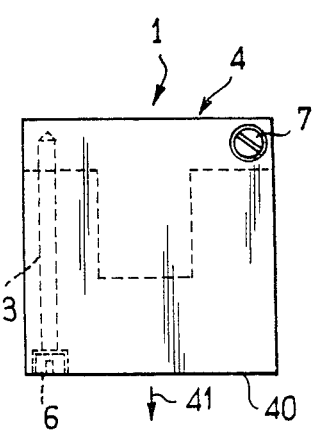
FIG_4

PROXIMITY DETECTOR, WITH ADJUSTABLE ORIENTATION OF ITS HEAD

BACKGROUND OF THE INVENTION

1. Field of the Invention

This invention relates to a proximity detector, the orientation of the head being adjustable.

Detectors of this kind are often switches which are used in installations or machinery in which the position of a component or movable metal object is required to be known. They may be fixed on a support which has one out of, for example, five specific positions relative to the movement of said object. In one of these positions a detector surface of the head must be oriented frontally instead of laterally in the case of the other positions.

The invention relates more particularly to a proximity detector comprising a casing, a mount adapted to be positioned on the casing in a number of orientations selectively about an axis and a detector head adapted to be connected to the mount in two orientations selectively, in one of which the detection direction is parallel to said axis while in the other of the two orientations the detection direction is a radial direction relative to the axis, such radial direction being defined by the orientation of the mount about the axis, the mount and the detector head together forming substantially a cube, a first edge of which is defined by the mount, the head being fixed to the mount by two screws which in each of the two orientations of the head relative to the mount extend along two second edges of the cube which are not concurrent to one another but which are both concurrent with the first edge.

2. Description of the Related Art

According to DE-U-No. 72 15 121, which substantially describes this structure, the two second edges are parallel to one another and the screws occupy one or other of two pairs of holes in the head depending on whether the head is in one or other of its two orientations. The head must therefore have found holes along four "second edges" and this obstructs the space available inside. Also, the fixing obtained is not optimum as regards even kind of impact and stress which may occur.

It is also known, for example from DE-A-No. 2 914 713, to fix the detector head of a proximity detector to the body of the device by means of screws extending through two parallel oblique holes disposed in a diagonal plane of the head. The same pair of holes in the head can be used for the two orientations (frontal and lateral) of the head, but there is a considerable amount of space lost in the head. To limit this disadavantage, the screws provided according to this document are relatively short to the detriment of the strength of the fixing. By offsetting the holes relatively to the diagonal plane DE-U-No. 73 44 278 proposes a solution which allows space to be saved in the head but which on the other hand necessitates the provision of two pairs of holes in the mount, each receiving screws in one of the two orientations of the head relative to the mount. Despite that, the saving in space in the head is minimal because if the fixing is to be strong the oblique holes must not extend far from the diagonal plane.

The whole of this prior art clearly shows the difficulty in finding a compromise between strength and internal volume of this type of device. The need to find such a compromise is particularly acute at the present time. Firstly, the tendency is to increase the useful range of detectors by the use of large-diameter magnetizable pots and windings. Also, the attempt is made to improve the quality of detection by integrating electronic components connected to the windings in the detector head completely or partially.

OBJECT OF THE INVENTION

The object of the invention thereof, in a device of the kind indicated in the preamble, is to increase on the one hand the inside volume of the detector head so that a large-diameter winding can be housed therein, and numerous connected electrical components, and also on the second hand the strength of fixing on the mount.

SUMMARY OF THE INVENTION

According to the invention, the proximity detector is characterised in that the two second edges are not parallel to one another and in that the two same holes of the mount and the two same holes of the head receive the screws in the two orientations of the head with respect to the mount.

Thus, as in DE-A-No. 29 14 713, two holes in the mount and two holes in the head are sufficient. Unlike DE-A-No. 29 14 713, however, these holes are adjacent to "second" edges of the cube in a space which is in any case difficult to use to house components. By comparison with DE-U-No. 72 15 121, only two "second" edges, and not four, are taken up by holes for the screws for fixing to the mount. Also, the resulting fixing is particularly strong because the two screws have crossed directions. The mount is also robust and compact since it has only two holes.

The Utility Model DE-U-No. 70 29 767 discloses a proximity detector in which a sensitive detector head of adjustable orientation uses a detection coil and connected electronic components without any traversing fixing screw, so that the volume available in this head can be fully devoted to the installation of a large-diameter coil and to numerous components.

In this case, however, the resulting saving is less than might be imagined, inasmuch as said head is housed between a body and a cover each having appreciable thickness. Also, this construction does not show from the outside the orientation selected since once it is mounted the head becomes completely invisible.

Other features and advantages of the invention will be apparent from the following description with reference to the accompanying drawings, which are given by way of example only.

BRIEF DESCRIPTION OF THE DRAWINGS

FIG. 1 is an exploded perspective view of a proximity detector according to the invention.

FIG. 2 is a side elevation of the detector of FIG. 1 operating in detection in a first lateral direction.

FIG. 3 is a front view of the detector of FIG. 2.

FIG. 4 is a top plan view of the detector of FIG. 2.

FIG. 5 is a partial back view of the detector of FIG. 2 in a partial section along line VV in FIG. 2.

FIG. 6 is a side elevation of the detector of FIG. 1 operating in frontal detection, and FIG. 7 is a partial elevation of the detector of FIG. 1 operating in detection in a second lateral direction.

DESCRIPTION OF THE PREFERRED EMBODIMENT

In the example shown in the drawings, the proximity detector of FIG. 1 according to the invention comprises basically a main casing 2, a fixing mount 3 of adjustable orientation and a detector head 4.

The casing 2 is of generally parallellepipedal shape with two opposite square surfaces, one of which is adjacent the mount 3. The axis of the parallelepiped passing through the centres of the square surfaces in denoted ZZ'.

The main casing 2 comprises a body 11 shown in chain dotted lines and a cover 12, these two parts being removable from one another to give access to an internal connector which is not shown because its construction is well known. Screws of axis FF' and GG', which occupy parallel ducts 9, 10, secure the cover 12 on the body 11 in operation. In the embodiment illustrated, on the side adjacent the mount 3 the cover 12 has a transverse projection 13 occupying a corresponding recess in the body. A base surface 8 of the body 11 remote from the cover 12 is applied against a wall in operation, to which wall it is secured, for example, by means of bolts of axis PP', QQ', which extend through the body 11 parallel to the screws of axis FF' and GG'.

On its surface facing the mount 3, this surface being partly defined by the projection 13, the cover 12 has a prismatic recess 14, through the base of which extends an eccentric aperture 15 and a central aperture 16 of axis ZZ'. Two parallel ribs 17 and 18 project towards one another in the recess in a common plane passing between the apertures 15 and 16, the recess being divided into two communicating portions 14a, 14b, of which the square portion 14a provided with the aperture 16 is centred on the axis ZZ'.

The central aperture 16 receives a traversing fixing screw 5, the head of which is accessible in the direction of the arrow K, i.e. from the interior of the casing 2, when the cover 12 is separated from the body 11.

The portion 14b is situated between the portion 14a and the front surface 19 of the cover 12. Extending through the eccentric aperture 15 is a flexible cord 20 containing electrical conductors which lead, directly or otherwise, to the above-mentioned connector. From the aperture 15 the cord 20 passes between the ribs 17, 18 to reach the portion 14a where it extends around the threaded shank of the screw 5, the volume of the portion 14a being adequate for this purpose.

As shown in FIGS. 2 to 7, the mount 3 and the head 4 together have the general shape of a cube the sidelength of which is equal to the sidelength of the square surfaces of the casing 2. A first edge 57 of the cube is defined by the mount 3.

The adjustable-orientation fixing mount 3 is formed in one piece and comprises a bracket formed by two rectangular arms 24, 25 which together form a right-angle edge coinciding with the first edge 57.

One 25 of the arms of the bracket is a base plate which during operation is applied against the surface of the cover 12 provided with the recess 14. The arm 25 is provided with a centering foot 50 of shallow height and square configuration to fit snugly in the portion 14a of the recess 14, selectively in one of four orientations H1, H2, H3, H4 of the mount 3 about the axis ZZ' with respect to the casing 2.

The arm or baseplate 25 has a tapped hole 35 to receive the screw 5 and also a through-hole 36 provided between said tapped hole 35 and said first edge 57. The cord 20 extends through said through-hole 36, which constantly registers with the portion 14a of the recess 14 irrespective of the orientation H1, H2, H3 or H4 of the mount 3 on the casing 2.

The arms 24 and 25 are rigidly connected by two gussets 26, 27 in the form of two triangular parallel fins 26, 27. A common edge 21 which bounds the two arms internally or externally may if required have a rounded shape and the gussets may have external curved configurations, one of which is shown in chain-dotted lines in FIG. 1.

Each of these gussets adjacent respectively one of the side edges of arms 24 and 25, bears a substantially prismatic boss on the side remote from the other gusset, there bosses 28 and 29 respectively extending along the first edge 57 of the cube as far as the respective ends thereof.

The proportions of the various parts making up the mount 3 can be defined by means of the following dimensions:

- A length b less than the side a of the cube measures the length of each of the two arms 24,25;
- The perpendicular sides 33, 34 of the gussets have a length c less than a;
- The widths d of the arms 24, 25 are also less than a;
- The bosses have a square cross-section of side e less than a.

One of the bosses 28 has a tapped hole 38 which is disposed near its end and which is parallel to the arm 25 while the other boss 29 has a tapped hole 39 which is disposed near its end and which is parallel to the arm 24; the axes VV' and WW' of these holes are also perpendicular to one another and to the edge 21 of said bracket, i.e. the edge 57 of the cube in operation.

The detector head 4 has a sensitive surface 40 which is the surface through which an electromagnetic beam 41 is propagated which is generated by an internal cylindrical pot and/or winding (not shown), generally having axes coinciding with that of the beam.

This pot or winding which has an outside diameter very close to the dimension a of the edge does not occupy zone neighboring on the cube edges and, a fortiori, the apices of the cube 40 inside the head.

Thus without any loss of useful space the head comprises along two second edges 45 and 47 which are perpendicular and not concurrent to one another, but which both converge towards the edge 57, two channels 43, 49 which each extend between one of the surfaces remote from the edge 57 and a surface 46, 51 of one of two notches 44, 52 formed in the head so as to receive the bosses 28, 29, the shape of which is complementary to that of the notches 44, 52. The head 4 can assume two positions on the mount 3, i.e. one in which the beam 41 is directed parallel to the axis ZZ' (FIG. 6) while the channel 43 and the hole 39 are aligned, as are the channel 49 and the hole 38, and another position in which the beam 41 has, relative to the axis ZZ', one of four radial orientations H1, H2, H3 or H4 depending on the orientation of the mount of the casing 2.

In this radial orientation of the head, the channel 43 is aligned with the hole 38 and the channel 49 is aligned with the hole 39.

In each position of the head 4 on the mount 3 the two channels 43, 49 and the two holes 38, 39 are occupied by a screw 6 or 7 screwed into one of the holes and extending in the channel situated in extension of this hole.

The perpendicular surfaces 53 and 54 of the detector head 4, the extensions of which intersect along the edge 57, each have recesses 56 and 55 respectively both of a width d and a length b measured from the edge 57. Between the notches 44, 52 and between the recesses 55, 56 the head 4 has a cavity 58, one wall 59 of which has the cord 20 extending through it in sealing-tight relationship. The length of the cord 20 has been greatly exaggerated in FIG. 1 in order to show the device in exploded form.

When mounted, the gussets 26, 27 fit between parallel walls such as 58a in the cavity 58 provided in the head 4. The cord 20 forms loops partly occupying the recess 14 as indicated above and partly the cavity 58 defined between the head, on the one hand, and the arms 24, 25 and gussets 26, 27 of the mount 3, on the other hand.

Irrespective of the position of the mount 3 the recess 55 or 56 associated with an exposed surface of the cube is filled by the arm 24.

Also, the resulting connection provides excellent strength between the head 4 and the mount because the arms 24, 25 of the mount fit exactly in the recesses 55, 56 or 56, 55.

Protection against lateral impacts on the detector head 4 is excellent because even in the most unfavourable cases one screw 6 or 7 is subjected to traction while the other is subjected to shear. The mount itself is protected against any accidental lateral movement because of the support that the centering foot 50 finds againt the walls of the portion 14a and against the ribs 17, 18 respectively after clamping of the screw 5 has provided a directional connection between the arm 25 and the outer surface 62 of the projection 13.

The features and steps described provide perfect mechanical strength by means of a small number of screws and holes, the screws having their anchoring points in a mount whose small size enables the detector head to have a larger volume to receive not only a large winding, with or without the pot, but also a large number of electronic components.

We claim:

1. A proximity detector comprising a casing, a mount adapted to be positioned on the casing in a number of orientations selectively about an axis and a detector head adapted to be connected to the mount in two orientations selectively, in one of which the detection direction is parallel to said axis while in the other of the two orientations the detection direction is a radial direction relative to the axis, such radial direction being defined by the orientation of the mount about the axis, the mount and the detector head together forming substantially a cube, a first edge of which is adjacent to the casing and is defined by the mount, the head being fixed to the mount by two screws which in each of the two orientations of the head relative to the mount extend along two second edges of the cube which are spaced apart from each other and perpendicular to each other and which both meet the first edge, wherein two same holes of the mount and two same holes of the head receive the screws in the two orientations of the head with respect to the mount, with one of said two screws extending substantially parallel to said axis and the other of said two screws extending perpendicular to and spaced from said axis in each of said two orientations of the head.

2. A proximity detector according to claim 1, wherein the mount comprises for positioning thereof on the casing a baseplate having, parallel to the first edge, a dimension which is less than a side-length of the cube, the mount also having on either side of said basepalte two bosses which extend along said first edge and are each provided with one of said two holes of the mount.

3. A proximity detector according to claim 2, wherein a recess adapted to receive a flexible electrical cord by which the head is connected to the interior of the casing is provided between two proximal ends of said bosses.

4. A proximity detector according to claim 2, wherein the baseplate forms part of a bracket further comprising an arm extending from the first edge perpendicularly to the baseplate.

5. A proximity detector according to claim 4, wherein the baseplate and the arm are connected by reinforcing fins from which the bosses extend in either direction along the first edge.

6. A proximity detection according to claim 2, wherein the detector head has a recess adapted to receive, in said two orientations of the detector head, the bosses, the baseplate, and an electrical cord connecting the head to the inside of the casing.

7. A proximity detector according to claim 6, wherein the mount also comprises an arm which in each of the two orientations of the head relative to the mount is integrated into a portion of said recess of the head, which portion is occupied by the baseplate in the other of said two orientations.

8. A proximity detector according to claim 6, wherein the mount also has two fins extending transversely to the first edge to fit between two walls of said recess, which walls are adapted to receive the cord therebetween.

9. A proximity detector according to claim 8, wherein the two fins each carry one of the bosses.

10. A proximity detector according to claim 8, wherein the two fins form gussets between the baseplate and an arm of the mount, said arm being in each of the two orientations of the head relative to the mount integrated in the recess of the head, at a place occupied by the baseplate in the other of these two orientations.

* * * * *